(12) United States Patent
Kim

(10) Patent No.: US 8,425,719 B2
(45) Date of Patent: Apr. 23, 2013

(54) PLASMA GENERATING APPARATUS

(75) Inventor: Hongseub Kim, Suwon-si (KR)

(73) Assignee: Jehara Corporation, Suwon-si (KR)

( * ) Notice: Subject to any disclaimer, the term of this patent is extended or adjusted under 35 U.S.C. 154(b) by 222 days.

(21) Appl. No.: 12/852,727

(22) Filed: Aug. 9, 2010

(65) Prior Publication Data
US 2012/0031561 A1    Feb. 9, 2012

(51) Int. Cl.
     *C23C 16/00*     (2006.01)
     *C23F 1/00*      (2006.01)
     *H01L 21/306*    (2006.01)
     *H05B 31/26*     (2006.01)

(52) U.S. Cl.
USPC .............. 156/345.48; 118/723 I; 118/723 IR; 156/345.49

(58) Field of Classification Search ............. 156/345.48, 156/345.49; 118/723 AN, 723 I, 723 IR; 315/111.51
See application file for complete search history.

(56) References Cited

U.S. PATENT DOCUMENTS

| | | | |
|---|---|---|---|
| 5,401,350 A * | 3/1995 | Patrick et al. | 156/345.48 |
| 6,417,626 B1 * | 7/2002 | Brcka et al. | 315/111.51 |
| 6,422,172 B1 * | 7/2002 | Tanaka et al. | 118/723 R |
| 2002/0170677 A1 * | 11/2002 | Tucker et al. | 156/345.48 |
| 2008/0168945 A1 * | 7/2008 | Kim | 118/723 I |

FOREIGN PATENT DOCUMENTS

| | | |
|---|---|---|
| JP | 10-172792 | 6/1998 |
| JP | 2006-216605 | 8/2006 |
| KR | 10-2005-0007624 | 1/2005 |
| KR | 10-2005-0011349 | 1/2005 |
| KR | 10-2006-0024690 | 3/2006 |
| WO | WO 2008/143405 | 11/2008 |

* cited by examiner

*Primary Examiner* — Rakesh Dhingra
(74) *Attorney, Agent, or Firm* — NSIP Law

(57) ABSTRACT

A plasma generating apparatus is provided. The plasma generating apparatus may include a vacuum chamber, an ElectroStatic Chuck (ESC), a first antenna part including a first antenna and a first antenna cover, and a second antenna part including a second antenna and a second antenna cover. The vacuum chamber has a vacant interior and a top sealed by an insulation vacuum plate. The ESC is disposed at a center of the inside of the vacuum chamber. The first antenna is coupled to a through-hole of the second antenna. The first antenna cover airtightly covers a top of the first antenna. The second antenna is coupled to the through-hole of the insulation vacuum plate. The second antenna cover airtightly covers a top of the first antenna part and the second antenna.

19 Claims, 8 Drawing Sheets

PLASMA GENERATING APPARATUS

BACKGROUND

1. Technical Field

The following description relates to a plasma generating apparatus. For example, the following description relates to a plasma generating apparatus including a first antenna part for generating plasma at an upper and central region of a substrate and a second antenna part for generating plasma at an upper and edge region of the substrate, and differently controlling the size of an electric current supplied to each antenna part and simultaneously, by differentiating an amount of gas supplied to the upper and central region and outer region of the substrate by means of a gas injection port formed at each antenna part, controlling a density of generated plasma depending on a position on the substrate and simultaneously controlling an etching characteristic and deposition characteristic of the substrate. The teachings herein may be variously applicable to semiconductor, Liquid Crystal Display (LCD), Organic Light-Emitting Diode (OLED), and solar cell processes and applicable to processing of materials applying plasma such as etching, Chemical Vapor Deposition (CVD), plasma doping, plasma cleaning, and the like.

2. Description of the Related Art

In general, plasma, an ionized gas, is the fourth state of matter that is not solid, liquid, and gas. Free electrons, positive ions, neutral atoms, and neutron molecules exist within plasma and incessantly interact with each other. The control of each component and concentration of free electrons, positive ions, neutral atoms, and neutron molecules is of significance. In engineering aspects, plasma is regarded as being in the field of gas, which can be formed and controlled by an external electric field.

The conventional plasma generating apparatus is described below.

FIG. 1 illustrates a plasma generating apparatus based on a Capacitively Coupled Plasma (CCP) scheme. The CCP plasma generating apparatus is constructed to generate plasma 18 based on capacitive coupling within a vacuum chamber 10, by installing two plate electrodes that are a source electrode 11 and an Electrostatic Chuck (ESC) (or a susceptor) 12 spaced a predetermined distance apart up/down within an upper and central region of a substrate 17, then placing the substrate 17 on a top surface of the ESC 12, and then applying a Radio Frequency (RF) power to the source electrode 11 and the ESC 12 from the external to form a strong electric field between the source electrode 11 and the ESC 12. Non-described reference numerals 13, 14, 15, and 16 denote a source RF power supply unit, a bias RF power supply unit, a source matcher, and a bias matcher, respectively. This conventional so-called CCP plasma generating apparatus can generate uniform plasma for a large scale target as well by using a plate capacitor.

FIGS. 2A to 2B illustrate a plasma generating apparatus based on an Inductively Coupled Plasma (ICP) scheme. The CCP plasma generating apparatus is constructed to generate plasma 28 based on inductive coupling, by placing a substrate 23 on a top surface of an ESC (or a susceptor) 22 within a vacuum chamber 21, applying a bias RF power to the ESC 22, and applying a source RF power to an antenna 26 disposed on a top surface of a ceramic vacuum plate 25 covering a top surface of the vacuum chamber 21 to induce a flow of an electric current, thus applying a magnetic field to the inside of the vacuum chamber 21 to form an inductive electric field by the applied magnetic field and accelerate electrons by the inductive electric field. Non-described reference numerals 24a and 27a denote a bias matcher and a source matcher, respectively. The conventional so-called ICP plasma generating apparatus can advantageously generate high density plasma compared to the CCP scheme. Also, the conventional so-called ICP plasma generating apparatus can generate high density plasma even at a low pressure of 10 mT or less at which the CCP scheme is impossible to do so and thus, is being widely used in a semiconductor process needing a low pressure characteristic.

Recently, semiconductor wafers have been large-sized to have a diameter of 300 mm beyond 200 mm and, from now on, are expected to be more large-sized to have a diameter of 450 mm. Particularly, in case of a large-size substrate, there is a need to differentiate densities of generated plasma from each other in an upper and central region of a substrate and an upper and edge region according to a process condition.

However, in case of the existing CCP scheme or ICP scheme, there is a problem that a density of plasma cannot be differently controlled depending on a position on the substrate.

SUMMARY

According to an aspect, an embodiment of the present invention may address at least the problems and/or disadvantages described herein and provide one or more advantages described below. According to another aspect, there is provided a plasma generating apparatus for controlling a density of generated plasma depending on a position on a substrate and simultaneously controlling an etching characteristic and a deposition characteristic of the substrate. Such apparatus may be variously applicable to semiconductor, Liquid Crystal Display (LCD), Organic Light-Emitting Diode (OLED), and solar cell processes and applicable to processing of materials applying plasma such as etching, Chemical Vapor Deposition (CVD), plasma doping, plasma cleaning, and the like.

According to still another aspect, a plasma generating apparatus is provided. The plasma generating apparatus includes a vacuum chamber, an ElectroStatic Chuck (ESC), a first antenna part including a first antenna and a first antenna cover, and a second antenna part including a second antenna and a second antenna cover. The vacuum chamber has a vacant interior and a top sealed by an insulation vacuum plate having a through-hole at a center. The ESC is disposed at a center of the inside of the vacuum chamber, and places a substrate on its top surface and receives an external bias Radio Frequency power. The first antenna is coupled to the through-hole of the second antenna, and airtightly covers the insulation vacuum plate, and is placed in a central region of the substrate. The first antenna cover airtightly covers a top of the first antenna, and has a gas injection port in its outer circumference surface. The second antenna is coupled to the through-hole of the insulation vacuum plate, and surrounds an upper and edge region of the substrate, and has a predetermined through-hole at its center. The second antenna cover airtightly covers a top of the first antenna part and the second antenna.

The first antenna is a first plate shape antenna in which a first concave part is downward indented and formed such that the first antenna is coupled to the through-hole of the second antenna, and a plurality of gas jet ports are formed in the first concave part.

The second antenna is a second plate shape antenna in which a second concave part is downward indented and formed such that the second antenna is coupled to the through-hole of the insulation vacuum plate.

The second antenna part further comprises at least one of the inductive coils extending along an outer circumference of the second plate shape antenna.

A gas injection port is formed in an upper and outer circumference surface of the second antenna cover.

A plurality of gas jet ports are formed in the second concave part.

The apparatus further includes a source RF power supply unit for supplying an RF power to the first antenna part and the second antenna part.

The apparatus further includes an impedance control means connected between the source RF power supply unit and the first antenna cover or between the source RF power supply unit and the second antenna cover, and densities of plasma generated by the first antenna in the upper and central region of the substrate and plasma generated by the second antenna in the upper and edge region of the substrate are independently controlled by the impedance control means.

The source RF power supply unit includes a first source RF power supply unit for supplying an RF power to the first antenna part, and a second source RF power supply unit for supplying an RF power to the second antenna part.

The apparatus further includes an insulation member for insulating between the first antenna and the second antenna.

The apparatus further includes insulation members or coating layers formed below the first concave part and the second concave part respectively for preventing RF arcing. The insulation members or coating layers have gas holes.

A ratio of Capacitive Coupling Plasma (CCP) component, which is a plasma component generated by the plate second shape antenna, to Inductive Coupling Plasma (ICP) component, which is a plasma component generated by the at least one of the inductive coils, is controllable by varying sizes of the impedance of the vacuum chamber and the impedance of the at least one of the inductive coils.

The second plate shape antenna is of a disk shape. The at least one of the inductive coils is of a shape including a first straight line part, a circular arc part, and a second straight line part. The first straight line part radially extends from the outer circumference surface of the second plate shape antenna. The circular arc part draws the same concentric circular arc as that of the second plate shape antenna while curve-extending from an end of the first straight line part. The second straight line part again radially extends from an end of the circular arc part.

The second plate shape antenna is of a rectangular shape. The at least one of the inductive coils is of a shape including a first straight line part, an extension part, and a second straight line part. The first straight line part perpendicularly extends from the outer circumference surface of the second plate shape antenna. The extension part again extends in parallel with the rectangular plate from an end of the first straight line part. The second straight line part again perpendicularly extends outside from an end of the extension part.

A front end part of the second straight line part is inserted into a concave groove part formed in a top surface of the vacuum chamber, and is coupled and fixed by a predetermined connector to a top surface of the vacuum chamber.

The apparatus further includes a capacitor. The capacitor is formed by interposing dielectric materials between the front end part of the second straight line part and the concave groove part of the vacuum chamber.

Other features and aspects will be apparent from the following detailed description, the drawings, and the claims.

Figure 1:
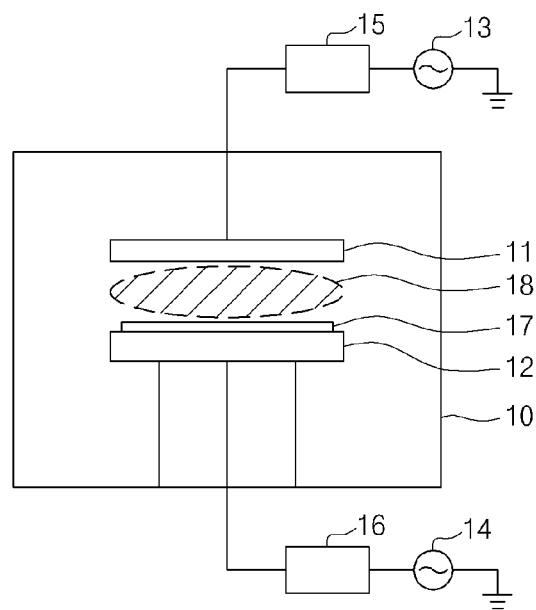
FIG. 1 is a schematic diagram illustrating an example of a plasma generating apparatus according to the conventional art.
Figure 2A:
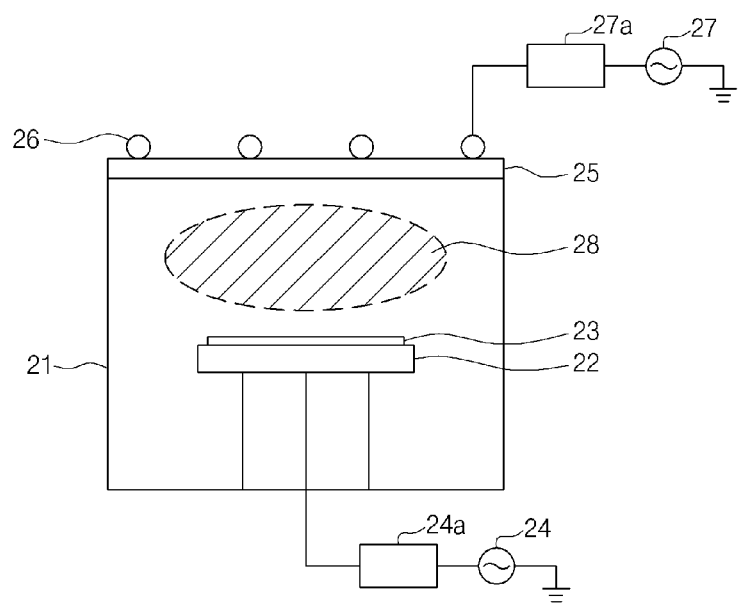
FIG. 2A is a schematic diagram illustrating another example of a plasma generating apparatus according to the conventional art.
Figure 2B:
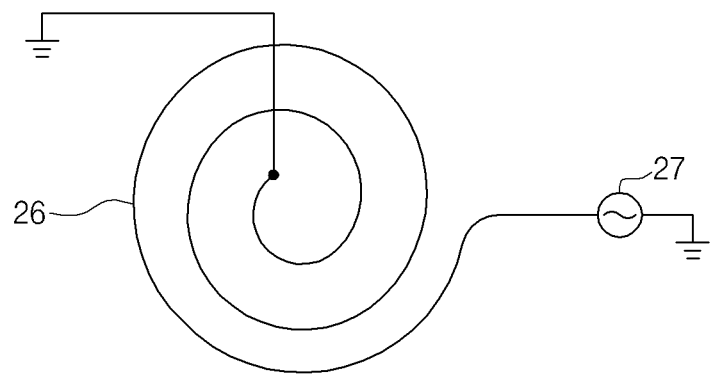
FIG. 2B is a schematic plane diagram illustrating an Inductively Coupled Plasma (ICP) antenna of FIG. 2A.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Figure 3:
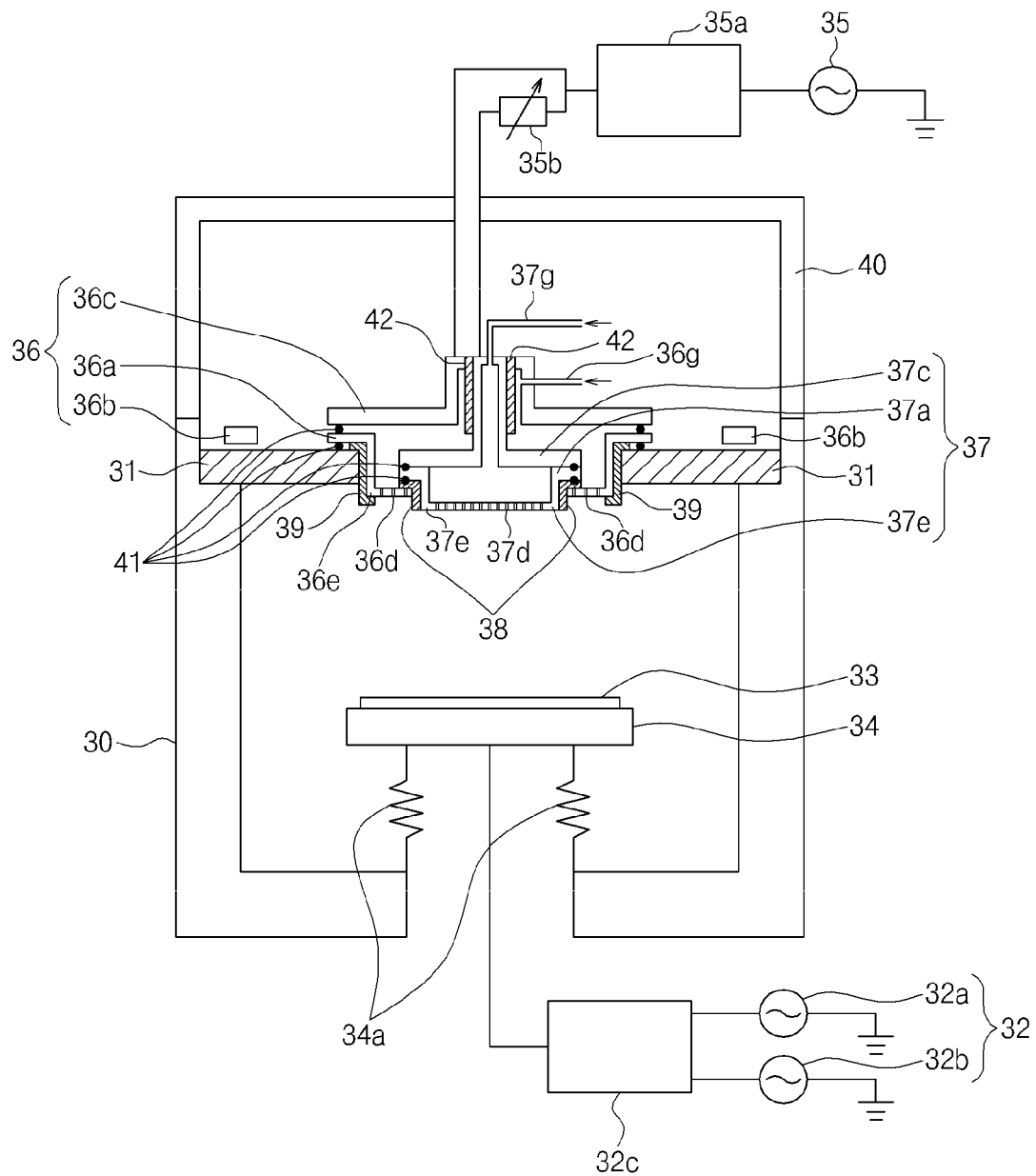
FIG. 3 is a schematic cross section illustrating a plasma generating apparatus according to an embodiment of the present invention.
Figure 4:
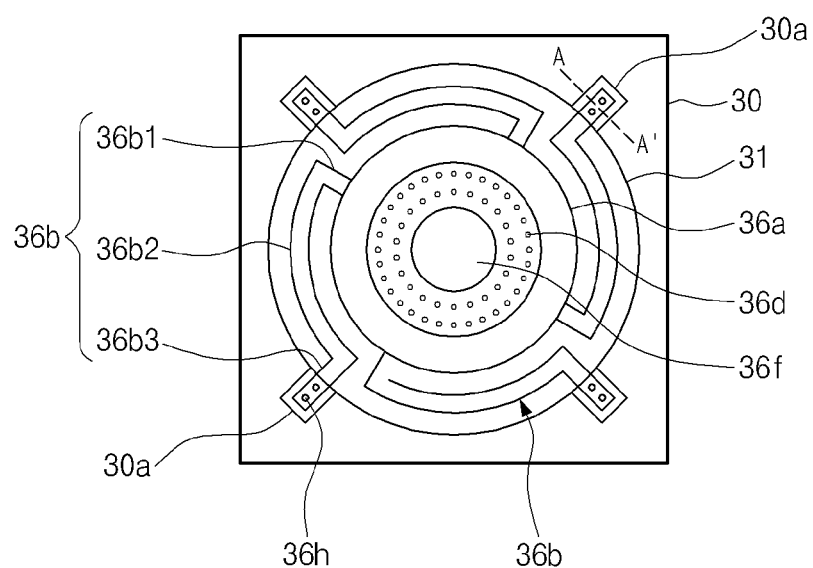
FIG. 4 is a plane diagram of FIG. 3.
Figure 5:
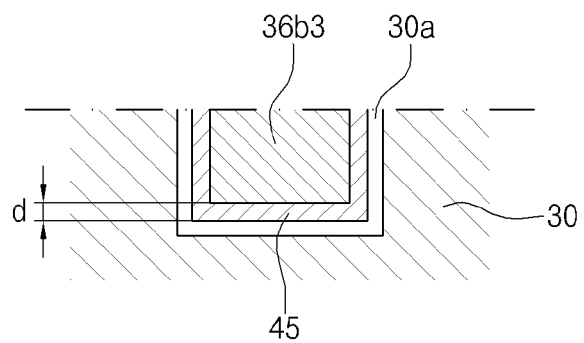
FIG. 5 is a cross section taken along line A-A' of FIG. 4.
Figure 6:
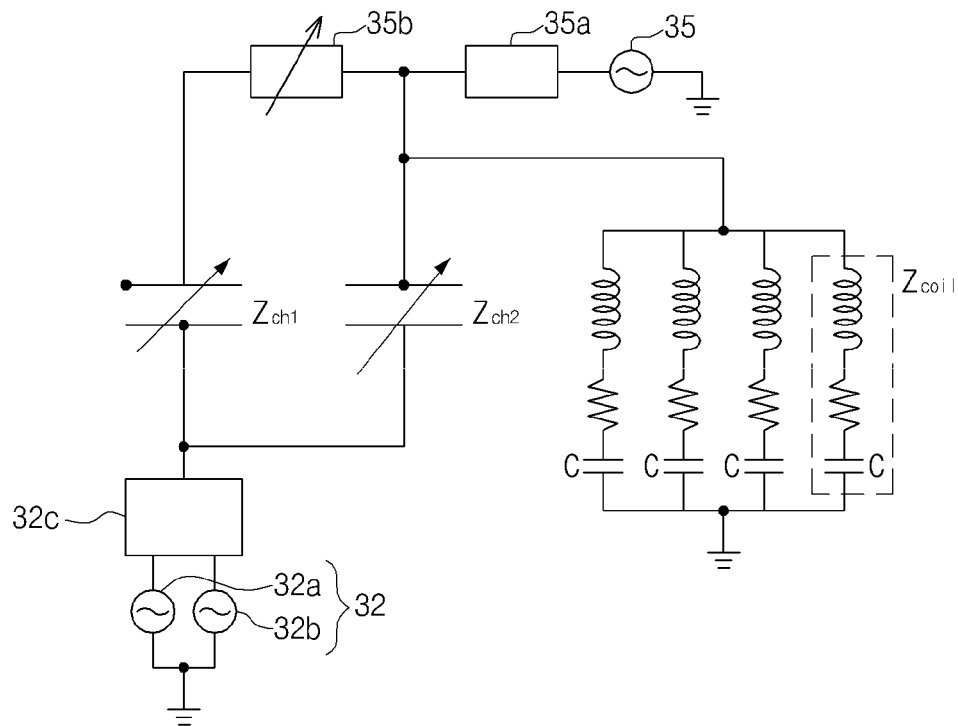
FIG. 6 is a schematic diagram illustrating an equivalent circuit of a plasma generating apparatus according to an embodiment of the present invention.

FIG. 3 is a schematic cross section illustrating a plasma generating apparatus according to an embodiment of the present invention. FIG. 4 is a plane diagram of FIG. 3. FIG. 5 is a cross section taken along line A-A' of FIG. 4. FIG. 6 is a schematic diagram illustrating an equivalent circuit of a plasma generating apparatus according to an embodiment of the present invention.

Referring to FIGS. 3 to 6, the plasma generating apparatus includes a vacuum chamber 30 whose interior is vacant and whose top is sealed by an insulation vacuum plate 31, an ElectroStatic Chuck (ESC) 34 disposed at an inner and central part of the vacuum chamber 30 and placing a substrate 33 on a top surface thereof, a first antenna part 37 including a first antenna 37a and a first antenna cover 37c, and a second antenna part 36 including a second antenna 36a and a second antenna cover 36c. The first antenna 37a is coupled to a through-hole of the second antenna 36a, and airtightly covers the insulation vacuum plate 31, and is placed in an upper and central region of the substrate 33. The first antenna cover 37c airtightly covers a top of the first antenna 37a, and has a gas injection port 37g at its outer circumference surface. The second antenna 36a is coupled to a through-hole of the insulation vacuum plate 31, and surrounds an upper and edge region of the substrate 33, and has a predetermined through-hole at its center. The second antenna cover 36c airtightly covers a top of the first antenna part 37 and the second antenna 36a, and has a gas injection port 36g at its outer circumference surface.

The vacuum chamber 30 is of a shape in which an interior is vacant and a top is opened. The opened top is sealed by the insulation vacuum plate 31 having a through-hole at center. On a top surface of the vacuum chamber 30 corresponding to an outer wall of the insulation vacuum plate 31, as illustrated in FIGS. 4 and 5, a concave groove part 30a is indented and formed to insert a front end part of a second straight line part 36b3 of an inductive coil 36b.

Naturally, the vacuum chamber 30 has a pumping port (not shown) for exhausting an internal gas at a predetermined portion of a lower end part thereof.

The ESC 34 is disposed at an inner and central part of the vacuum chamber 30 and is a plate shape in which the substrate is placed on a top surface thereof. A bellows tube 34a is prepared on a bottom surface of the ESC 34 and controls a gap between the first antenna part 36 and the ESC 34 while elevating up/down. An external bias RF power supply unit 32 supplies a bias RF power to the ESC 34.

The bias RF power supply unit 32 comprises apply a bias low frequency RF power supply unit 32a for supplying a bias low frequency RF power to the ESC 34 and a bias high frequency RF power supply unit 32b for supplying a bias high frequency RF power to the ESC 34.

The first antenna part 37 includes the first antenna 37a that is a first plate shape antenna coupled to the through-hole 36f of the second antenna 36a and airtightly covering the through-hole of the insulation vacuum plate 31 together with the second antenna 36a, and the first antenna cover 37c having the gas injection port 37g airtightly covering the first antenna 37a. The first antenna part 37 generates plasma (P) based on capacitive coupling forming an electric field with the ESC 34 by the source RF power applied from the external. Also, a gas jet port 37d is formed in the first concave part 37e indented and formed downward of the first antenna 37a.

The second antenna part 36 includes the second antenna 36a that is a second plate shape antenna airtightly covering the through-hole of the insulation vacuum plate 31, the inductive coil 36b extending from an outer circumference surface of the second antenna 36a, and the second antenna cover 36c having the gas injection port 36g airtightly covering the first antenna part 37 and the second antenna 36a. Also, according to an aspect, the second antenna part 36 is of a combination structure of the second antenna 36a generating plasma (P) based on capacitive coupling forming an electric field with the ESC 34 by the source RF power applied from the external, and the inductive coil 36b generating plasma (P) based on inductive coupling.

Also, in the second antenna part 36, the second antenna 36a with a predetermined through-hole 36f has a second concave part 36e downward indented and formed such that the second antenna 36a is coupled at its center to the through-hole of the insulation vacuum plate 31. A plurality of gas jet ports 36d are formed in the second concave part 36e and jet a gas, which is introduced through the gas injection port 36g of the second antenna cover 36c, into the vacuum chamber 30.

An impedance control element 35b is an impedance element for controlling the amount of an electric current flowing to the second antenna cover 36c or the first antenna cover 37c from a source RF power supply unit 35 through a source matcher 35a. That is, by controlling the amount of the electric current flowing to the second antenna cover 36c or the first antenna cover 37c through the impedance control element 35b, the plasma generating apparatus can vary a density of plasma in an upper and central region and an upper and edge region of the substrate 33. According to an embodiment of the present invention, the impedance control element 35b can be any one of a parallel resonance circuit, a serial resonance circuit, a parallel variable resonance circuit, and a serial variable resonance circuit.

Figure 7A:
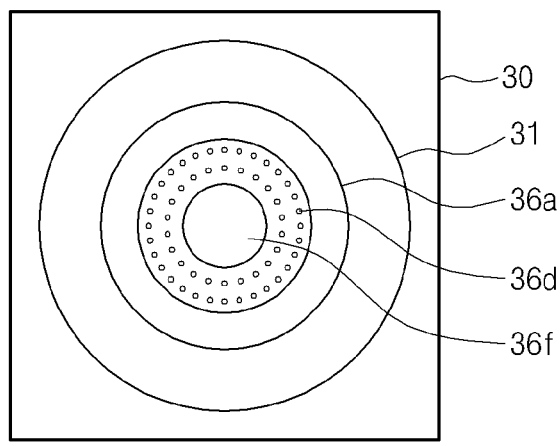
FIGS. 7A to 7C are schematic plane diagrams illustrating a second antenna part of a plasma generating apparatus according to another embodiment of the present invention.
Figure 7B:
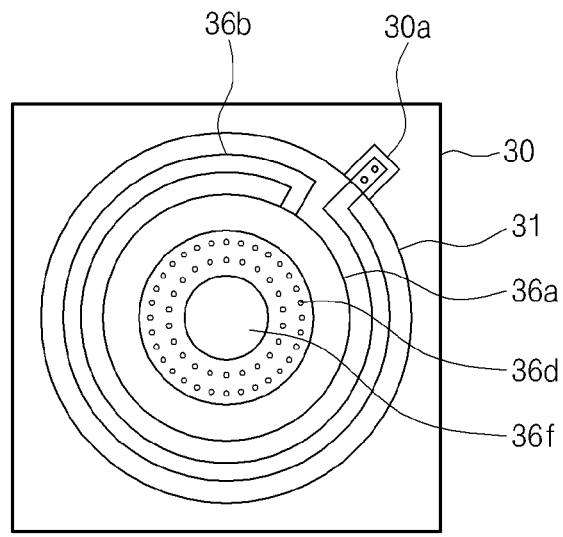
Figure 7C:
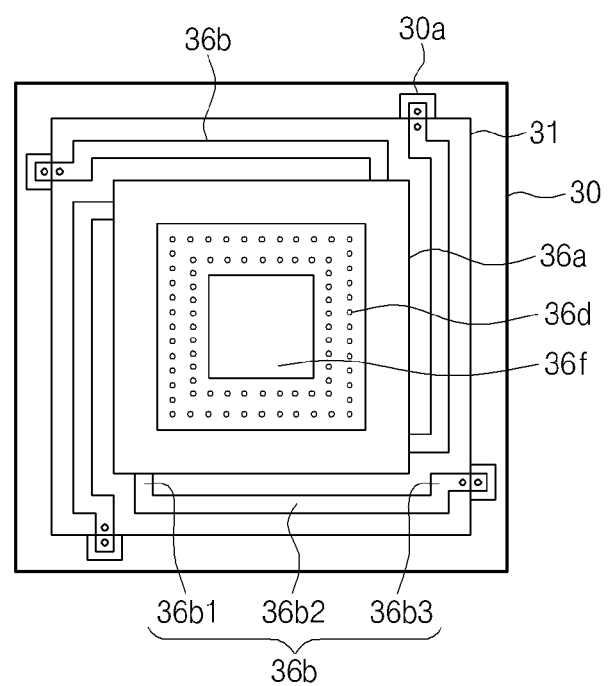

FIGS. 7A to 7C are schematic plane diagrams illustrating a second antenna part 36 of a plasma generating apparatus according to another embodiment of the present invention.

A shape of the second antenna part 36 is described below in detail with reference to FIG. 4 and FIGS. 7A to 7C.

According to a first example embodiment, as illustrated in FIG. 4, the second plate shape antenna 36a of the second antenna part 36 is of a disk shape having the predetermined through-hole 36f in which the first antenna 37a is coupled. The inductive coil 36b is connected to an outer circumference surface of the second plate shape antenna 36a. The inductive coil 36b is of a shape including a first straight line part 36b1 radially extending from an outer circumference surface of the second plate shape antenna 36a, a circular arc part 36b2 drawing the same concentric circular arc as the second plate shape antenna 36a while curve extending from an end of the first straight line part 36b1, and the second straight line part 36b3 again radially extending from an end of the circular arc part 36b2. The inductive coil 36b can be extension formed in an n-point branch structure at an outer circumference surface of the second plate shape antenna 36a.

In another embodiment of the present invention, FIG. 7A illustrates a case that a second antenna part 36 includes only a second plate shape antenna 36a and there is no separate inductive coil 36b.

In a further embodiment of the present invention, FIG. 7B illustrates a case that a second antenna part 36 is of a single structure in which a single inductive coil 36b is extension formed at an outer circumference surface of a second plate shape antenna 36a.

In a yet another embodiment of the present invention, FIG. 7C illustrates that a second plate shape antenna 36a is of a rectangular plate shape, and an inductive coil 36b is of a multi-stage bending straight line shape including a first straight line part 36b1 perpendicularly extending from an outer circumference surface of the second plate shape antenna 36a, an extension part 36b2 again extending from an end of the first straight line part 36b1 in parallel with a rectangular plate, and a second straight line part 36b3 again perpendicularly extending outside from an end of the extension part 36b2. This rectangular substrate 33 may be applicable to various fields such as an LCD, an OLED, a solar cell, etc.

According to an aspect, it may be desirable that an area ratio of the first and second plate shape antennas 36a and 37a to substrate 33 is equal to or is more than 1/25.

For example, assuming that 'Sp' denotes an area of the first and second plate shape antennas 36a and 37a, and 'Sw' denotes an area of the substrate 33, a formula of Sp>(1/25)Sw is given. Here, the 'Sp' means a summed area of the first antenna 37a and the second antenna 36a.

According to another aspect, it may also be desirable that a ratio of summed area of the first and second plate shape antennas 37a and 36a and the inductive coil 36b to area of the substrate 33 is equal to or is more than 1/25.

For example, when assuming that 'Sc' denotes an area of a coil type antenna, 'Sp' denotes an area of the plate shape antenna, and 'Sw' denotes an area of the substrate 33, a formula of Sp+Sc>(1/25)Sw is given.

Referring again to FIGS. 4 and 5, a front end part of the second straight line part 36b3 of the inductive coil 36b is inserted into the concave groove part 30a formed at a top surface of the vacuum chamber 30 and is coupled and fixed to the vacuum chamber 30 by a predetermined connector 36h.

And, for example, the plasma generating apparatus further includes a capacitor at the front end part of the second straight line part 36b3 of the inductive coil 36b. According to an aspect, the capacitor is constructed by interposing a dielectric material 45 between the front end part of the second straight line part 36b3 of the inductive coil 36b and the concave groove part 30a of the vacuum chamber 30.

Referring again to FIG. 3, a non-described reference numeral 38 denotes an insulation member for insulating the first antenna 37a and the second antenna 36a, a non-described reference numeral 39 denotes an insulation member for insulating the insulation vacuum plate 31 and the second antenna 36a, and a non-described reference numeral 42 denotes an insulation member for insulating the first antenna cover 37c and the second antenna cover 36c. Also, a non-described reference numeral 40 denotes a frame case, and a non-described reference numeral 41 denotes a seal for maintaining airtightness between the insulation vacuum plate 31 and the second antenna 36a, or between the second antenna 36a and the second antenna cover 36c, or between the second antenna 36a and the first antenna 37a, or between the first antenna 37a and the first antenna cover 37c.

The plasma generating apparatus according to an embodiment generates plasma (P) within the vacuum chamber 30, by placing the substrate 33 on the top surface of the ESC 34 within the vacuum chamber 30, controlling a gap between the second antenna part 36 and the ESC 34 using the bellows tube 34a, applying the source and bias RF powers to the vacuum chamber 30 through the respective matchers 32c and 35a, and injecting gas through the gas injection ports 36g and 37g to jet the gas through the gas jet ports 36d and 37d.

Also, by controlling the impedance of the impedance control element 35b, a density of generated plasma in the upper and central region and the upper and edge region of the substrate 33 can be varied. Also, a gas injection amount introduced through the gas injection ports 37g and 36g of the first antenna cover 37c and second antenna cover 36c, according to the upper and central region and the upper and edge region of the substrate 33, can be varied. By doing above, an etching characteristic and deposition characteristic of the upper and central region and the upper and edge region of the substrate 33 can be controlled.

Among the bias RF power, the bias low frequency RF power generally has a range of 100 kHz to 4 MHz, and the bias high frequency RF power generally has a range of 4 MHz to 100 MHz.

And, in the upper and outer region of the substrate 33 is formed plasma (P) of a mixed form of plasma (P) based on capacitive coupling (CCP scheme) formed between the second plate shape antenna 36a of the second antenna part 36 and the ESC 34 and plasma (P) based on inductive coupling (ICP scheme) resulting from the inductive coil 36b. On the other hand, in the upper and central region of the substrate 33 is generated only the plasma (P) based on capacitive coupling (CCP scheme) between the first antenna 37a and the ESC 34. However, as in FIG. 7A, in case that the second antenna part 36 includes only the second plate shape antenna 36a, only the plasma (P) based on capacitive coupling may be generated even in the upper and edge region of the substrate 33.

The CCP scheme and the ICP scheme each can each control a component. Referring to an equivalent circuit of FIG. 6, Equation is given below:

$$Z_{ch} = Z_{ch1} + Z_{ch2} = 1/\omega C_{ch}$$

$$C_{ch} = \in (A/d_{gap})$$

In Equation, the '$Z_{ch}$' is the impedance of the vacuum chamber 30, and considers both the impedance ($Z_{ch2}$) of the second plate shape antenna 36a of the second antenna part 36 and the impedance ($Z_{ch1}$) of the first antenna part 37. The '$C_{ch}$' represents a capacitance of the vacuum chamber 30. The impedance value can be controlled by controlling a capacitance value.

The '$\in$' represents a dielectric ratio within the vacuum chamber 30, and approximates to '$\in_0$' at low pressure.

The 'A' represents an area of the first and second plate shape antenna 37a or 36a. The '$d_{gap}$' represents a length of the gap between the first and second plate shape antenna 37a or 36a and the ESC 34. By controlling the gap, a ratio of a CCP component can increase or decrease. In general, if the gap gets narrower, the '$Z_{ch}$' gets smaller and thus, the ratio of the CCP component increases.

Inversely, if the gap gets larger, the '$Z_{ch}$' increases and thus, the CCP component decreases.

In FIG. 6, the impedance ($Z_{coil}$) of the inductive coil 36b can be given as $Z_{coil} = R + j\omega L + 1/j\omega C$.

Here, when the 'j' is an imaginary unit ($j^2 = -1$), the '$\omega$' is a frequency, the 'L' is an inductance, and the 'C' is a capacitance, $C = \in(S/d)$ can be given.

As illustrated in FIG. 5, a capacitor is formed by interposing dielectric materials 45 between the inductive coil 36b and the vacuum chamber 30.

The '$\in$' is a dielectric constant of the dielectric materials 45, the 'S' is an area of the dielectric materials 45, the 'd' represents a thickness of the dielectric materials 45. The 'C' can be changed by controlling the thickness (d) of the dielectric materials 45.

The dielectric materials 45 can be materials of Teflon, Vespel, Peek, ceramic, etc.

Figure 8:
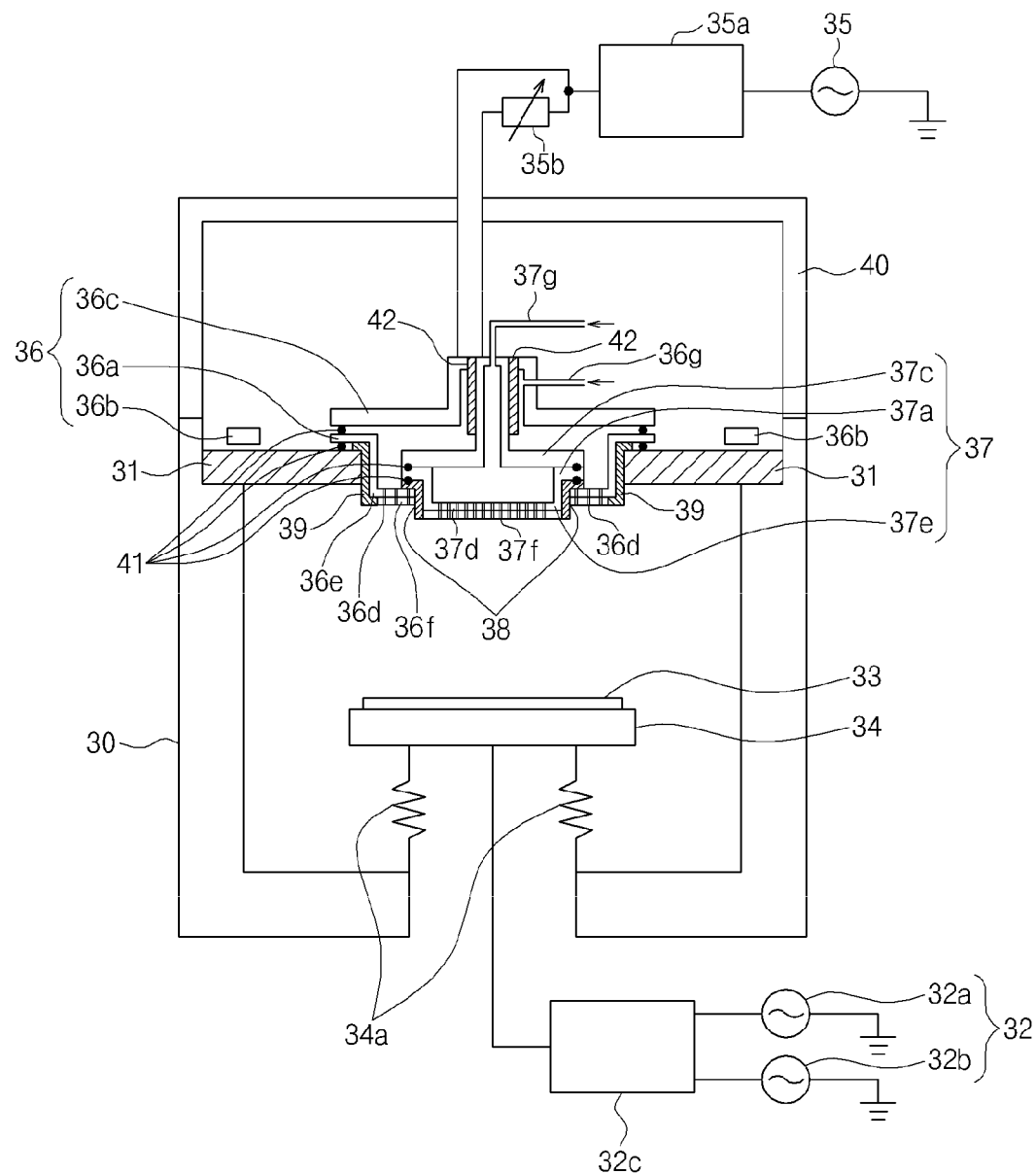
FIG. 8 is a schematic cross section illustrating a plasma generating apparatus according to another embodiment of the present invention.
Figure 9:
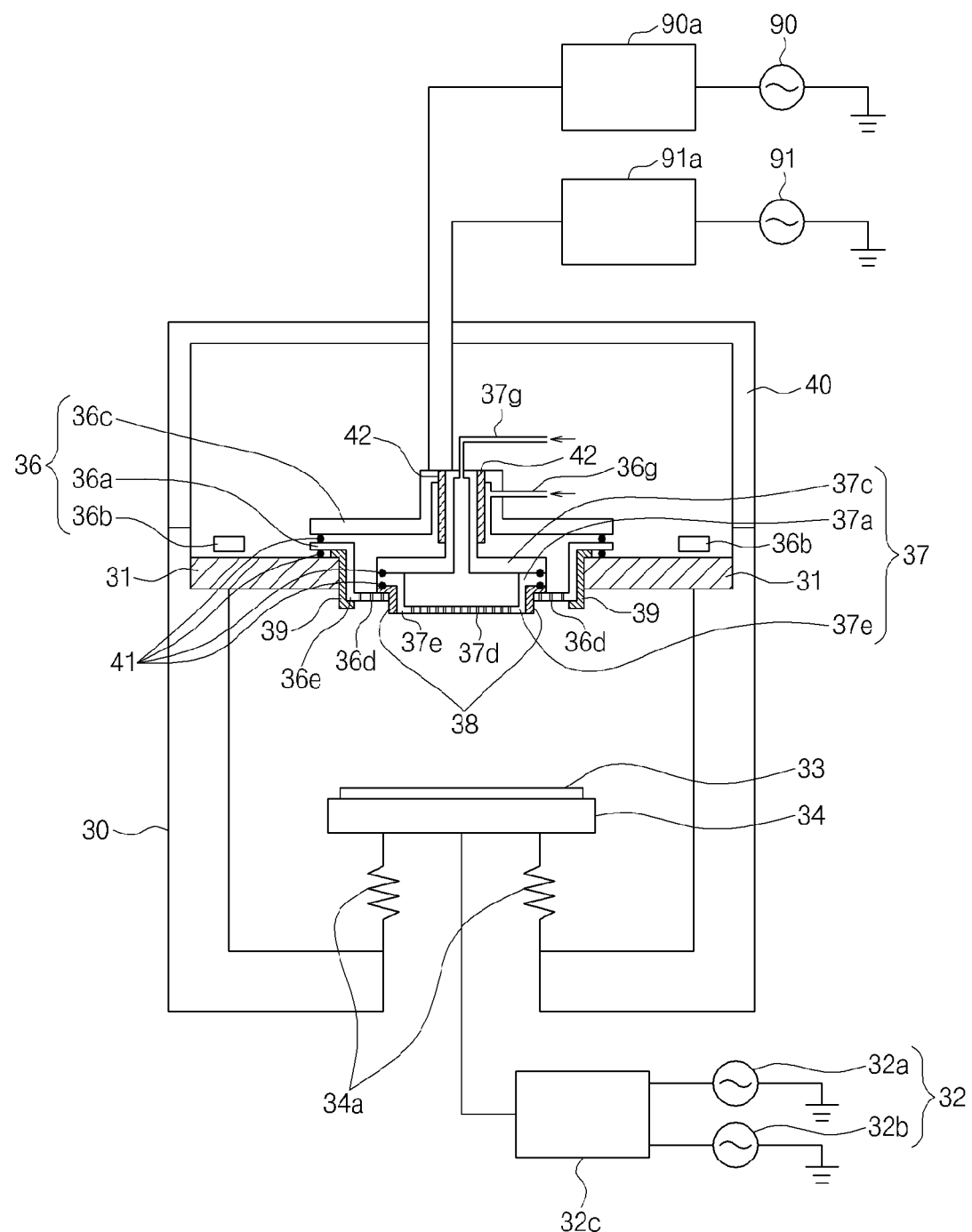
FIG. 9 is a schematic cross section illustrating a plasma generating apparatus according to a further embodiment of the present invention.

FIGS. 8 and 9 are schematic plane diagrams illustrating antenna parts of plasma generating apparatuses according to other embodiments of the present invention.

Referring to FIG. 8, insulation members or coating layers 37f and 36f for preventing RF arching can be further included below a first concave part 37e and a second concave part 36e, respectively. The insulation members or coating layers 36f and 37f have gas holes. According to one aspect, the insulation members or coating layers 36f and 37f can use any one of ceramic, silicon, quarts, Vespel, Teflon, and Peek. The example embodiment of FIG. 8 has the similar construction as the plasma generating apparatus of FIG. 3 besides a structural difference of including the insulation members or the coating layers 36f and 37f.

In another embodiment of the present invention, as illustrated in FIG. 9, an intensity of an electric current supplied to a upper and central region and upper and edge region of a substrate 33 can be varied by separately providing a source RF power supply unit 91 and a source matcher 91a for supplying an electric current to a first antenna part 37 and a source RF power supply unit 90 and a source matcher 90a for supplying an electric current to a second antenna part 36. This is different from a scheme of FIG. 3 of supplying an electric current with one power source 35 or 35a and controlling the supplied electric current using the impedance control element 35 installed only in one side between the first antenna cover 37c or second antenna cover 36c. The example embodiment of FIG. 8 has the similar construction as the plasma generating apparatus of FIG. 3 excepting that the source part is separately constructed. Undoubtedly, the embodiments of FIGS. 3, 8, and 9 can be combined with each other and constructed.

As described above, a plasma generating apparatus according to an embodiment can include a first antenna part for generating plasma at a upper and central region of a substrate and a second antenna part for generating plasma at an upper and edge region of the substrate, and differently control the amount of an electric current supplied to each antenna part and simultaneously, by differentiating an amount of gas supplied to the upper and central region and upper and edge region of the substrate by means of a gas injection port formed at each antenna part, can control a density of generated plasma depending on a position on the substrate and simultaneously control an etching characteristic and deposition characteristic of the substrate. This scheme is variously applicable to semiconductor, Liquid Crystal Display (LCD), Organic Light-Emitting Diode (OLED), and solar cell processes and simultaneously, is applicable to processing of materials applying plasma such as etching, Chemical Vapor Deposition (CVD), plasma doping, plasma cleaning, and the like.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A plasma generating apparatus comprising:
a vacuum chamber whose top is sealed by an insulation vacuum plate comprising a through-hole at a center;
a first antenna part comprising
a first plate shape antenna, and
a first antenna cover airtightly covering a top of the first plate shape antenna; and
a second antenna part comprising
a second plate shape antenna coupled to the through-hole of the insulation vacuum plate, and comprising a predetermined through-hole coupled to the first plate shape antenna at center, and
a second antenna cover airtightly covering a top of the first antenna part and the second plate shape antenna,
wherein the first plate shape antenna comprises a first concave part that is downward indented and formed such that the first plate shape antenna is coupled to the through-hole of the second plate shape antenna, and
wherein the second plate shape antenna comprises a second concave part that is downward indented and formed such that the second plate shape antenna is coupled to the through-hole of the insulation vacuum plate, wherein
the first plate shape antenna comprises a first part formed on the second concave part of the second plate shape antenna; and
the first concave part of the first plate shape antenna is formed through the through-hole of the second plate shape antenna, and is formed below the second concave part.

2. The apparatus of claim 1, wherein the first concave part comprises a plurality of gas jet ports.

3. The apparatus of claim 1, wherein the second antenna part further comprises at least one inductive coil extending along an outer circumference of the second plate shape antenna.

4. The apparatus of claim 3, wherein a gas injection port is formed in an upper and outer circumference surface of the second antenna cover.

5. The apparatus of claim 4, wherein the second concave part comprises a plurality of gas jet ports.

6. The apparatus of claim 3, wherein a ratio of a Capacitive Coupling Plasma (CCP) component, which is a plasma component generated by the second plate shape antenna, to an Inductive Coupling Plasma (ICP) component, which is a plasma component generated by the at least one inductive coil, is controllable by varying sizes of an impedance of the vacuum chamber and an impedance of the at least one inductive coil.

7. The apparatus of claim 6, wherein:
the second plate shape antenna is of a disk shape; and
the at least one inductive coil is of a shape comprising a first straight line part radially extending from the outer circumference of the second plate shape antenna, a circular arc part drawing the same concentric circular arc as that of the second plate shape antenna while curve-extending from an end of the first straight line part, and a second straight line part again radially extending from an end of the circular arc part.

8. The apparatus of claim 7, wherein:
the second straight line part comprises a front end part; and
a concave groove part is formed in a top surface of the vacuum chamber, and
wherein the front end part is inserted into the concave groove part, and is coupled and fixed by a predetermined connector to the top surface of the vacuum chamber.

9. The apparatus of claim 8, further comprising a capacitor formed by interposing dielectric materials between the front end part of the second straight line part and the concave groove part of the vacuum chamber.

10. The apparatus of claim 6, wherein:
the second plate shape antenna is of a rectangular shape; and
the at least one inductive coil is of a shape comprising a first straight line part perpendicularly extending from the outer circumference of the second plate shape antenna, an extension part again extending in parallel with the rectangular shape from an end of the first straight line part, and a second straight line part again perpendicularly extending outside from an end of the extension part.

11. The apparatus of claim 10, further comprising:
a capacitor,
wherein the second straight line comprises a front end part,
wherein a concave groove part is formed in a top surface of the vacuum chamber,
wherein the front end part is inserted into the concave groove part, and is coupled and fixed by a predetermined connector to the top surface of the vacuum chamber, and
wherein the capacitor is formed by interposing dielectric materials between the front end part of the second straight line part and the concave groove part of the vacuum chamber.

12. The apparatus of claim 3, further comprising:
insulation members or coating layers formed below the first concave part and the second concave part, respectively, to prevent RF arching,
wherein the insulation members or coating layers comprise gas holes.

13. The apparatus of claim 1, further comprising a source RF power supply unit configured to supply an RF power to the first antenna part and the second antenna part.

14. The apparatus of claim 13, further comprising an impedance control means connected between the source RF power supply unit and the first antenna cover or between the source RF power supply unit and the second antenna cover, and configured to independently control densities of plasma generated by the first plate shape antenna in an upper and central region of a substrate and plasma generated by the second plate shape antenna in an upper and edge region of the substrate.

15. The apparatus of claim 13, wherein the source RF power supply unit comprises:
 a first source RF power supply unit configured to supply the RF power to the first antenna part; and
 a second source RF power supply unit configured to supply the RF power to the second antenna part.

16. The apparatus of claim 1, further comprising an insulation member configured to insulate between the first plate shape antenna and the second plate shape antenna.

17. The apparatus of claim 1, further comprising:
 insulation members or coating layers formed below the first concave part and the second concave part, respectively, to prevent RF arching,
 wherein the insulation members or coating layers comprise gas holes.

18. The apparatus of claim 1, wherein a gas injection port is formed in an upper and outer circumference surface of the second antenna cover.

19. The apparatus of claim 18, wherein the second concave part comprises a plurality of gas jet ports.

* * * * *